(12) United States Patent
Fishkin

(10) Patent No.: US 6,311,702 B1
(45) Date of Patent: Nov. 6, 2001

(54) MEGASONIC CLEANER

(75) Inventor: Boris Fishkin, San Carlos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/191,060

(22) Filed: Nov. 11, 1998

(51) Int. Cl.$^7$ .................................................. B08B 3/10
(52) U.S. Cl. ..................... 134/1.3; 134/25.4; 134/184; 134/902; 310/335; 310/323.19
(58) Field of Search .................................. 134/184, 186, 134/1, 1.3, 902; 310/335, 323.19

(56) References Cited

U.S. PATENT DOCUMENTS

| | | | |
|---|---|---|---|
| 2,831,785 | * | 4/1958 | Kearney . |
| 2,864,592 | * | 12/1958 | Camp . |
| 2,950,725 | * | 8/1960 | Kacke et al. . |
| 2,987,068 | * | 6/1961 | Branson ........................ 134/184 |
| 3,168,659 | | 2/1965 | Bayre et al. . |
| 3,795,358 | * | 3/1974 | Sarnacki et al. . |
| 3,958,559 | * | 5/1976 | Glenn et al. . |
| 4,001,766 | * | 1/1977 | Huewitz . |
| 4,423,637 | * | 1/1984 | Soloway . |
| 4,444,146 | * | 4/1984 | Dewitz et al. . |
| 4,854,337 | * | 8/1989 | Bunkenburg et al. . |
| 5,003,516 | | 3/1991 | Sato et al. . |
| 5,071,776 | * | 12/1991 | Matsushita et al. . |
| 5,088,510 | * | 2/1992 | Bannon ........................ 134/902 |
| 5,090,432 | | 2/1992 | Bran . |
| 5,143,106 | * | 9/1992 | Bannon . |
| 5,159,945 | * | 11/1992 | Bannon . |
| 5,368,054 | | 11/1994 | Koretsky et al. . |
| 5,383,484 | | 1/1995 | Thomas et al. . |
| 5,562,778 | | 10/1996 | Koretsky et al. . |
| 5,593,505 | | 1/1997 | Erk et al. . |
| 5,653,816 | * | 8/1997 | Ekberg . |
| 5,803,099 | * | 9/1998 | Sakuta et al. . |

FOREIGN PATENT DOCUMENTS

| | | | |
|---|---|---|---|
| 61194727 | 8/1986 | (JP) . | |
| 64-18229 | * 1/1989 | (JP) | ........................ 134/902 |
| 01095521 | 4/1989 | (JP) . | |
| 6-196465 | * 7/1994 | (JP) | ........................ 134/902 |
| 11028432 | 2/1999 | (JP) . | |
| WO 96/22844 | 8/1996 | (WO) . | |

* cited by examiner

Primary Examiner—Frankie L. Stinson
(74) Attorney, Agent, or Firm—Dugan & Dugan

(57) ABSTRACT

A transducer is coupled either directly in a linear relationship, or remotely in an angular relationship, to a focusing element. The transducer and focusing element preferably extend a length at least equal to the diameter of a substrate to be cleaned thereby. The transducer and focusing assembly impart focused megasonic energy to a fluid in contact therewith. Three embodiments of a cleaning system which advantageously employ the transducer/focuser assembly are disclosed. The transducer/focuser assemblies preferably focus megasonic energy in a line across the substrate's surface, the substrate is then scanned past the lines of energy such that the substrate's entire surface is cleaned.

7 Claims, 5 Drawing Sheets

MEGASONIC CLEANER

FIELD OF THE INVENTION

The present invention relates to cleaning fragile substrates with sonic energy. More specifically, the present invention relates to an improved semiconductor wafer cleaning system which employs megasonic energy.

BACKGROUND OF THE INVENTION

A conventional method for cleaning particles from semiconductor wafers is known as megasonic cleaning. During megasonic cleaning, a transducer oscillates between compressed and strained states at a near 1 MHz rate. The transducer is operatively coupled to a source of fluid, either a fluid filled tank, or fluid flowing through a nozzle. The megasonic oscillation output by the transducer is thereby coupled to the fluid causing pressure oscillation therein. As the pressure in the fluid oscillates between positive and negative, cavitation or bubbles form in the liquid during negative pressure and collapse or shrink during positive pressure. This bubble oscillation gently cleans the surface of the wafer.

In practice, megasonic cleaners experience a number of limitations. For instance, transducers with higher power density assure better cleaning efficiency, but generate considerable heat during operation. Accordingly, transducer cooling systems are often used to prevent degradation of adhesive material that attaches a transducer to materials that couple the transducer's acoustic power to the cleaning fluid.

Such transducer cooling systems, however, undesirably increase the cost and complexity of a megasonic cleaning system.

An alternative approach has been to employ a cycled array of multiplexed transducers in which each transducer is on only 1/Nth of the cycle time, where N is the number of transducers per cleaning vessel.

The reduction of duty cycle by a factor of N, which is usually 8 for batch processing vessels for 8 inch wafers, reduces transducer temperatures and in some cases eliminates the need for transducer cooling systems. A major problem of this approach is the often unacceptable increase in processing time by a factor of N. The increase in processing time is particularly problematic for single wafer processing, where short processing time is an important requirement.

Another problem experienced by megasonic cleaners is the shadowing of the transducer's acoustic field by the wafer carrying cassette. Conventionally, two approaches are employed to address cassette shadowing. The first approach uses wafer rocking to expose shadowed parts of the wafers to acoustic field. This approach reduces the duty cycle on the shadowed parts of the wafers and thus increases the wafer's processing time. This approach also increases system cost and complexity. The second approach uses a convex transducer or convex cylindrical lens to diverge the transducer's acoustic field through the opening in the bottom of the cassette. This approach reduces the power density at the top of the cassette and increases the processing time required to clean the wafers.

Cavitation bubbles formed in the cleaning fluid during megasonic cleaning present additional challenges. Specifically bubble implosion near the surface of a wafer helps to remove particles and thus has a positive effect on cleaning efficiency. However, bubbles in the bulk of cleaning solution (i.e., not near the wafer's surface) scatter the acoustic power and thus cause a decreasing power density along the surface of the wafer as the distance from the transducer increases.

Accordingly, a need exists for an improved method and apparatus for sonic cleaning of semiconductor wafers.

SUMMARY OF THE INVENTION

The present invention provides an assembly wherein an elongated transducer is coupled to a focusing element. The focusing element may be a concave cylindrical lens, a concave cylindrical energy emitting surface of the transducer or a concave cylindrical reflector, etc. The focusing element may be coupled in line with the transducer (see FIG. 1A) or in an angular relationship (see FIG. 1B). Both the elongated transducer and the focusing element preferably extend a distance slightly greater than the diameter of the wafer, so as to megasonically clean a line from one edge of the wafer to the other. The wafer may then be translated or rotated (or the transducer and/or focusing element may be translated or rotated) so that megasonic energy scans the entire surface of the wafer.

Because the megasonic power is focused, the power density increases from the transducer to a focal point which may be positioned, preferably on or beyond the surface of the wafer. Thus, with the present invention, the power to the surface of the transducer may be lower; therefore lowering operating temperatures, and eliminating the need for costly cooling systems. Moreover, the power output by the transducer may be selected such that cavitation occurs only near the wafer surface. In this manner the bubbles do not scatter portions of the transmitted acoustic wave, rendering the transducer assembly highly efficient.

In a first embodiment a megasonic cleaning system which employs the inventive assembly comprises a tank filled with liquid for submerging a wafer. A transducer and focusing element are coupled in a linear relationship (forming a transducer/focuser assembly, see FIG. 2) and are positioned adjacent the wafer's first major surface. Preferably at least two such transducer/focuser assemblies are positioned in a spaced relationship adjacent the wafer's first major surface. The spacing between the transducer/focuser assemblies is selected to minimize the movement necessary to scan megasonic energy across the surface of the wafer.

A scanning mechanism is coupled to the transducer/focuser assemblies and/or the wafer to translate or rotate the same so that megasonic energy is scanned across the entire first major surface of the wafer. A similar array of transducer/focuser assemblies can be positioned adjacent the wafer's second major surface so that both the first and second surfaces may be cleaned simultaneously provided each transducer/focuser assembly focuses acoustic energy on or before the nearest major surface of the wafer. Alternatively, a single array of transducer/focuser assemblies can clean both major surfaces of a wafer provided the assemblies acoustic energy is focused on or beyond the farthest major surface of the wafer, and thus travels through the wafer causing cavitation along both major surfaces thereof.

In a second embodiment an inventive megasonic cleaning system which employs the inventive transducer/focuser assembly comprises a tank filled with liquid for submerging a wafer. The transducer/focuser assembly is coupled in an angular relationship, preferably with the transducer positioned adjacent the tank's bottom and the focusing element (e.g. a parabolic reflector) positioned adjacent a major surface of the wafer Preferably, a plurality of focusing elements, each slightly greater in length than the wafer's longest chord, are spaced along the wafer's first major surface such that a small movement of the wafer and/or the transducer/focuser assembly scans megasonic energy across the entire first surface of the wafer. A scanning mechanism is coupled to the wafer and/or the transducer/focuser assemblies to translate or rotate the same. A single array of transducer/focuser assemblies can clean both major surfaces of a wafer provided the assembly's acoustic energy is focused on or beyond the farthest major surface of the wafer, and thus travels through the wafer causing cavitation along both major surfaces thereof.

In a third embodiment a megasonic cleaning system which employs the inventive transducer/focuser assembly comprises a tank containing liquid for partially submerging a wafer. Preferably the tank is sized to submerge half of the wafer in the liquid, and a transducer/focuser assembly coupled in a linear relationship is positioned to focus megasonic energy on a first surface of the wafer slightly below an air/liquid interface. A scanning mechanism coupled to the wafer rotates the wafer such that megasonic energy scans the entire surface of the wafer. Preferably, a transducer/focuser assembly is focused slightly below the air/liquid interface of a second major surface of the wafer to enable simultaneous cleaning of both major surfaces of the wafer.

This embodiment conserves cleaning fluid, as the wafer is only partially submerged. Further, if the transducer/focuser assembly is located near the air/liquid interface the tank may be designed with a narrow lower region which is only slightly wider than the wafer, and with an upper region wide enough to house properly positioned transducer/focuser assemblies.

Finally, a fourth embodiment of an inventive cleaning system which employs the inventive transducer/focuser assembly is configured similar to the third embodiment; however, rather than partially submerging the wafer, the fourth embodiment employs a transducer/focuser assembly configured as a nozzle which sprays liquid energized with focused megasonic energy at the diameter of the wafer.

As described further below, each of the embodiments of the invention achieves uniform cleaning at relatively low energy levels and with efficient energy transmission, thus avoiding the problems associated with conventional megasonic cleaners. Other objects, features and advantages of the present invention will become more fully apparent from the following detailed description of the preferred embodiments, the appended claims and the accompanying drawings.

DETAILED DESCRIPTION OF THE PREFERRED EMBODIMENTS

Figure 1A:
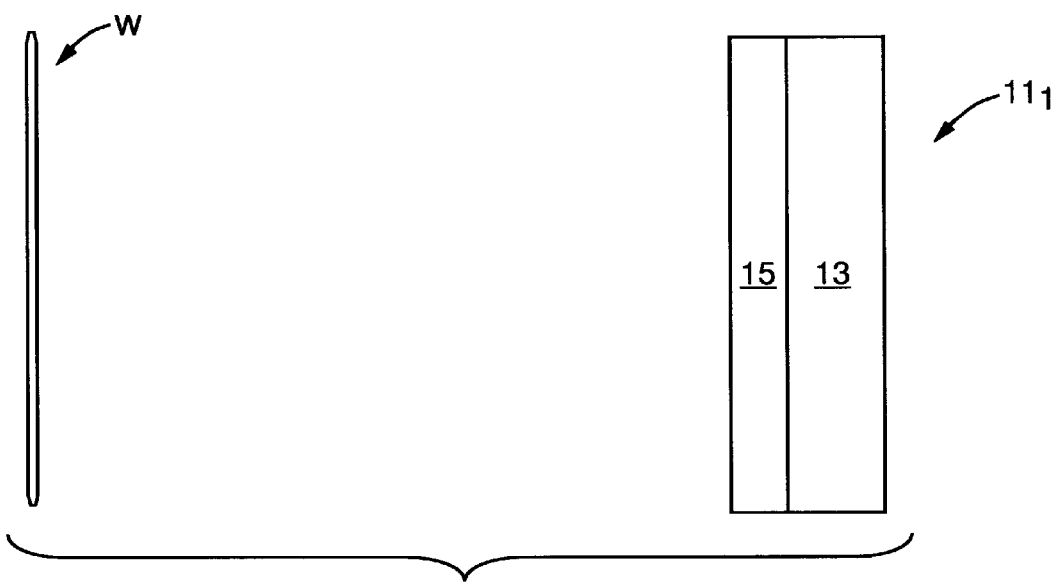
FIG. 1A is a top plan view of an inventive transducer/focuser assembly directly coupled in a linear relationship.

FIG. 1A is a top plan view of an inventive transducer/focuser assembly $11_1$ comprising a transducer 13 and a focusing element 15, such as a concave cylindrical lens, or a concave cylindrical surface of the transducer, etc. The transducer 13 and the focusing element 15 are operatively coupled to each other in a linear relationship. In practice the transducer 13 may be mounted on an outside wall of a fluid chamber, and coupled through the wall to the focusing element 15 contained within the fluid chamber. The transducer/focuser assembly $11_1$ is shown in position to emit focused sonic energy to a wafer w.

In operation, energy is applied to the transducer 13, e.g. via an oscillating electrical power source (not shown). The energy level is selected so that when focused a desired cleaning power density is achieved. Similarly, the focal length of the focusing element, and the focusing element's position relative to the wafer w, is selected in conjunction with the electrical power applied to the transducer 13 so that a desired cleaning power is achieved along the surface of the wafer w. Preferably the electrical power, the focal length, the focusing element's position relative to the wafer w's surface, and the liquid to be energized by the transducer are selected such that cavitation occurs only near the wafer w's surface. Thus, virtually no energy is lost due to scattering caused by the bubbles. The focal point is preferably positioned beyond the major surface of the wafer so that both front and back surfaces are cleaned.

Figure 1B:
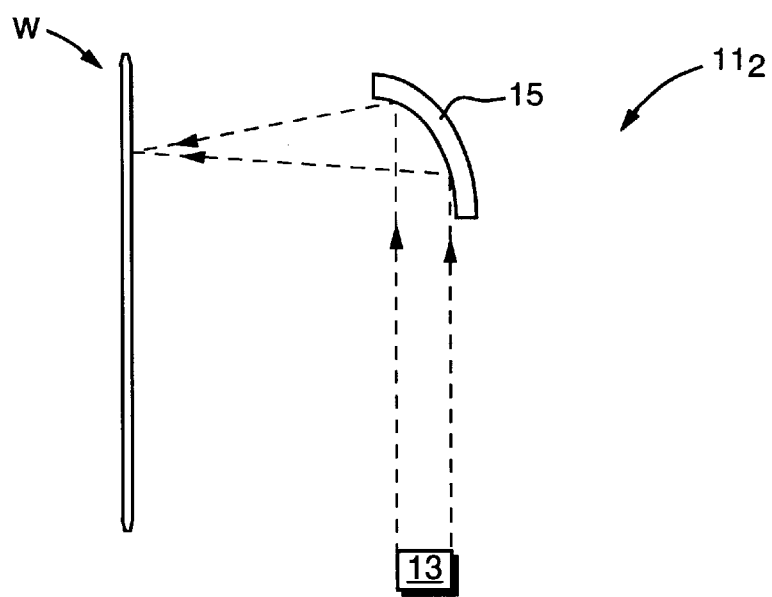
FIG. 1B is a diagrammatic side plan view of an inventive transducer/focuser assembly distantly coupled in an angular relationship.

FIG. 1B is a diagrammatic side plan view of an inventive transducer/focuser assembly $11_2$ wherein the transducer 13 and the focusing element 15 are distantly coupled in an angular relationship. The transducer 13 and the focusing element 15 of FIG. 1B are coupled at a 90° angle. In operation the transducer 15 emits megasonic energy waves directed toward the focusing element 15 (e.g., a parabolic cylinder reflector). The focusing element 15 is configured to receive the megasonic energy waves and reflect them in a second direction, in this example >90° from the first direction, to a focal line on the surface of the wafer w, and so that power reflected from the wafer does not return to the reflector, lens or transducer.

The inventive elongated transducer/focuser assembly not only provides effective cleaning at lower transducer powers and temperatures, it cleans a uniform line across the wafer's surface. When used within a fluid containing tank the inventive elongated transducer/focuser assembly provides superior cleaning in a fast, fluid-efficient system, as described with reference to FIGS. 2–5.

Figure 2A:
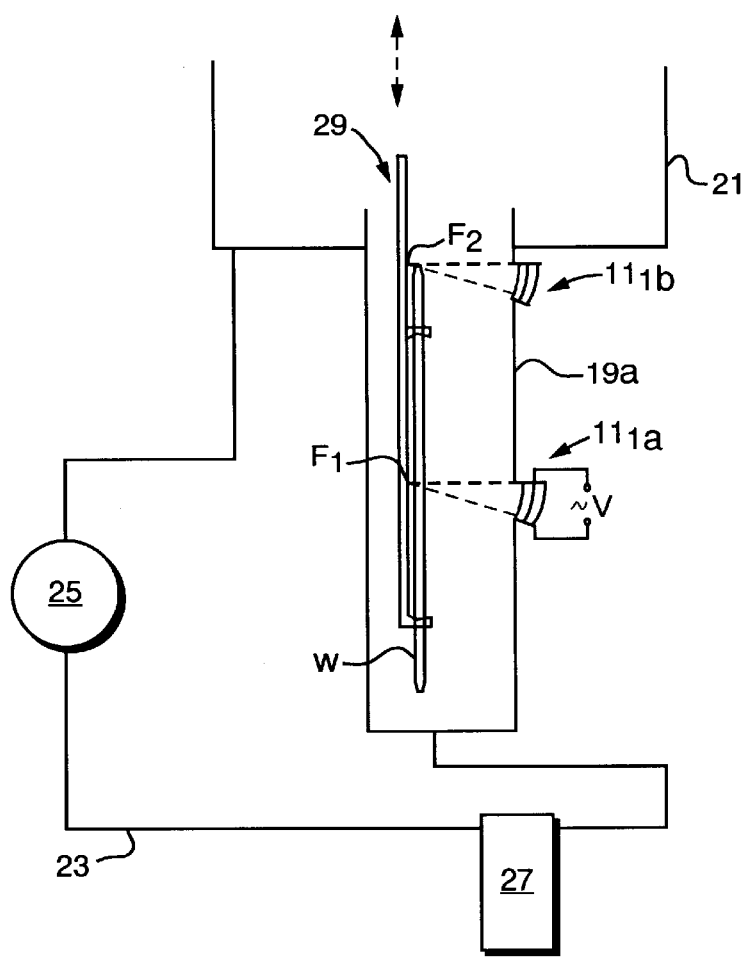
FIG. 2A is a diagrammatic side plan view of a first embodiment of an inventive cleaning system that employs the inventive transducer/focuser assembly of FIG. 1A.
Figure 2B:
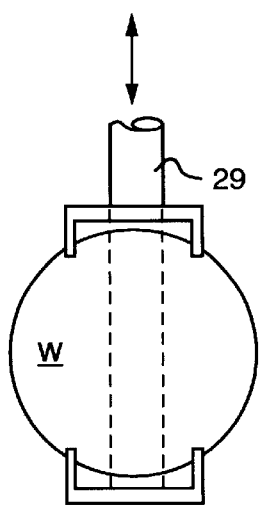
FIG. 2B is a front plan view of the wafer support and scanning mechanism of FIG. 2A.

FIG. 2A is a diagrammatic side elevational view of an inventive cleaning system 17 configured in accordance with a first embodiment. The cleaning system 17 comprises a tank 19a which is just wide enough to allow positioning of a wafer w beside a first transducer/focuser assembly $11_1a$ and a second transducer/focuser assembly $11_1b$. The first transducer/focuser assembly $11_1a$ and the second transducer/focuser assembly $11_1b$ are vertically spaced by a distance x.

The tank 19a's length and depth are sufficient to fully submerge a wafer w therein, and preferably only slightly larger than the dimensions of the wafer w, so as not to require excess liquid. The tank 19a has an open top side to which is coupled an overflow weir 21. A fluid connection such as a pipe 23 provides fluid coupling along the bottom of the overflow weir 21, a pump 25, a filter 27 and the bottom of the tank 19a, so that a fluid contained within the tank 19a may be recirculated and cleaned as described below.

A scanning mechanism 29, such as a lifting/lower mechanism is coupled to the wafer w for lifting and lower the wafer w past the first transducer/focuser assembly $11_1a$ and the second transducer/focuser assembly $11_1b$, such that a first line of focused megasonic energy $F_1$ from the first transducer/focus assembly 11a scans across a first half of the wafer w's first major surface, and a second focused line of megasonic energy $F_2$ from the second transducer/focuser assembly 11b scans across a second half of the wafer w's first major surface. The scanning mechanism contacts only the outer edges of the wafer as shown in the front plan view of FIG. 2B.

Preferably, the first transducer/focuser assembly $11_1a$ and second transducer/focuser assembly $11_1b$ are configured such that the megasonic energy output therefrom is focused on the back surface of the wafer w, which faces away from the transducer/focuser assemblies $11_1a$, $11_1b$ and such that cavitation occurs along both the front and back surfaces of the wafer w so as to achieve simultaneous cleaning of both major surfaces of the wafer w. The focusing element of the transducer/focuser assemblies $11_1a$, $11_1b$ comprises a non-conducting partial tube which couples acoustic power to the cleaning fluid and isolates the transducer's electrodes from the cleaning fluid, and the transducer portion of the transducer/focuser assemblies $11_1a$, $11_1b$ comprises a partial tube. Alternatively, the transducer can be flat, and the focuser can be a concave cylindrical lens for focusing acoustic power and for isolating the transducer's electrode from the cleaning fluid.

In operation, the tank 19a is filled with a cleaning fluid such as de-ionized water, an ammonium hydroxide solution or any other cleaning solution, and the scanning mechanism 29 lowers the wafer w into the tank 19a submerging the wafer w therein. The first transducer/focuser assembly $11_1a$ and second transducer/focuser assembly $11_1b$ then are energized with oscillating electrical power. The megasonic energy output by each of the transducer/focuser assemblies $11_1a$, $11_1b$ is focused as it travels through the respective focusing element 15a, 15b. Focused megasonic energy is therefore coupled to the cleaning fluid and travels therethrough to a focal point on or near the back surface of the wafer w.

The wafer w is then lifted and lowered by the distance x, such that the first transducer/focuser assembly $11_1a$ scans a line of megasonic energy along the lower half of the wafer w, and the second transducer/focuser assembly $11_1b$ scans a line of megasonic energy along the upper half of the wafer w, thereby cleaning the entire surface of the wafer w.

The focused megasonic energy and cavitation along the wafer w's front and back surfaces clean the wafer w's surfaces, yet because cavitation occurs only along the wafer w's surfaces, energy is not scattered by the bubbles and cleaning is more efficient. Because the transducer/focuser assemblies $11_1a$, $11_1b$ extend uniformly a length at least equal to the wafer w's diameter, cleaning is more uniform than that achieved with a smaller transducer. The inventive transducer/focuser assemblies focused energy allows such larger transducers to be employed without increasing the operating temperature experienced across the transducer.

While the wafer w is being scanned, cleaning fluid is continually pumped through the pipe 23 to the tank 19a. The fluid in the tank 19a therefore continually spills over the top of the tank 19a into the overflow weir 21. Fluid is then pumped from the overflow weir 21 through the filter 27 and back into the bottom of the tank 19a, via the pump 25. Particles cleaned from the surface of the wafer w typically collect on the top of the cleaning fluid. Because the fluid continually overflows into the overflow weir 21, the particles are therefore continually swept from the top surface of the fluid into the overflow weir 21. The filter 27 then filters particles from the fluid and the fluid is pumped back into the tank 19a.

Figure 3:
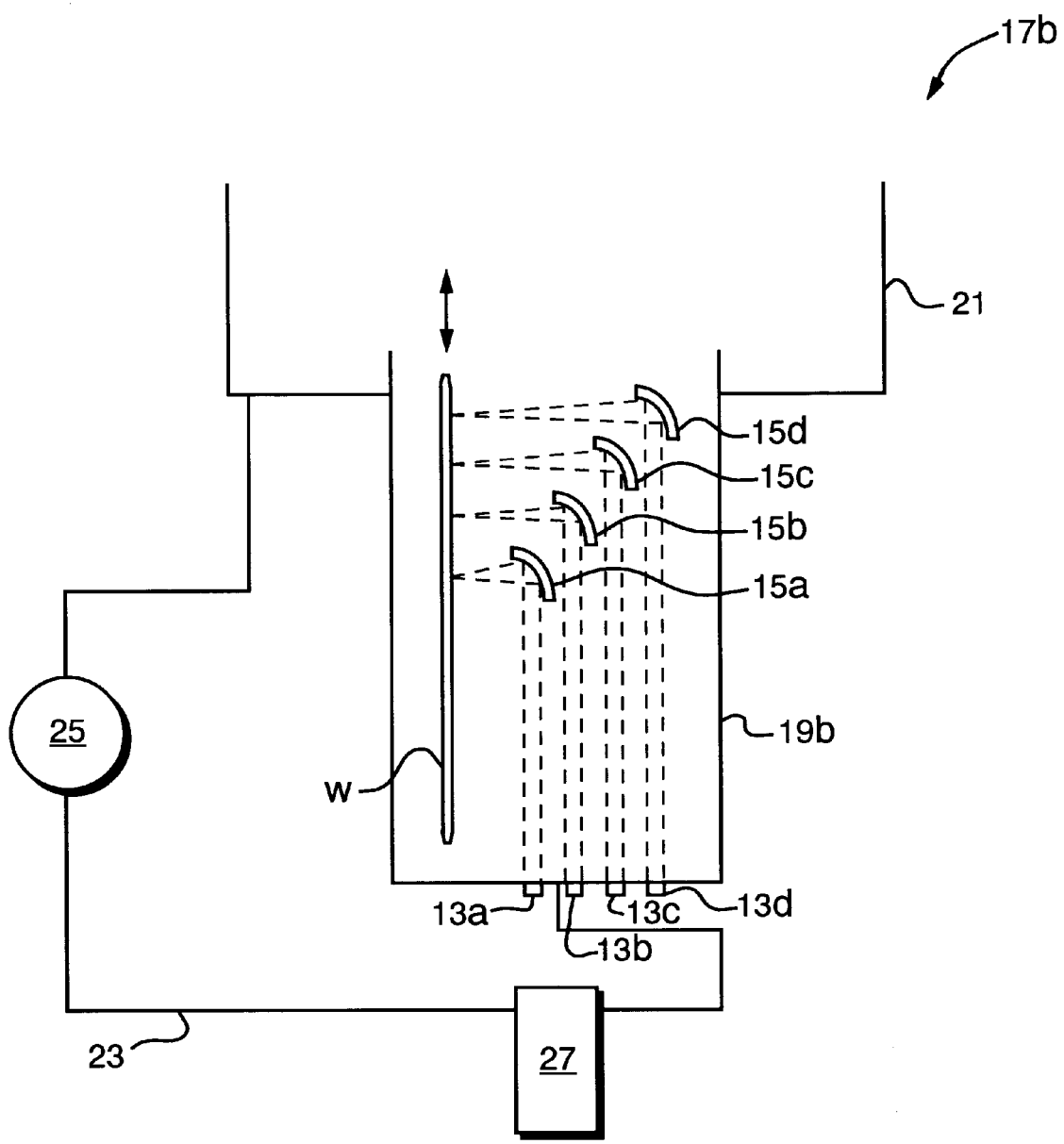
FIG. 3 is a diagrammatic side plan view of a second embodiment of an inventive cleaning system that employs the inventive transducer/focuser assembly of FIG. 1B.

FIG. 3 is a diagrammatic side elevational view of an inventive cleaning system 17b configured in accordance with a second embodiment. The cleaning system 17b comprises the tank 19b, the overflow weir 21, the pipe 23, the pump 25 and the filter 27 described with reference to FIG. 2. Each of these components is configured and operates as described with reference to FIG. 2. The description thereof is therefore not repeated with reference to FIG. 3.

The tank 19b of FIG. 3 is somewhat wider than that of FIG. 2, to enable coupling of the transducer 13 and the focusing element 15 in an angular relationship (the transducer/focuser assembly $11_2$ of FIG. 1B), rather than in the linear relationship of FIGS. 1A and 2. Specifically, a plurality of transducers 13a–d are spaced horizontally along the bottom of the tank 19b. The transducers 13a–d extend a length at least equal to the wafer w's diameter. A plurality of focusing elements 15a–d are vertically spaced along the wafer w's first surface. Each focusing element 15a–d is coupled to one of the transducers 13a–d positioned below. Thus, the focusing elements 15a–d are spaced horizontally as well as vertically.

The focusing elements 15a–d are preferably parabolic cylinder reflectors that extend a length at least equal to the length of the corresponding transducer 13a–d. The focusing elements 15a–d are designed to receive megasonic energy waves from the transducers 13a–d positioned along the bottom of the tank 19b, and to reflect and focus the energy onto the back surface of the wafer w. The transducer's acoustic energy and the focal point of the focusing elements 15a–d are selected to achieve cavitation along both the front and back surfaces of the wafer w. Thus, a plurality of focused lines of megasonic energy scan both the front and the back surfaces of the wafer w as the wafer w is lifted and/or lowered by the scanning mechanism 29.

The closer the vertical spacing between the focusing elements 15a–d, the smaller the distance the scanning mechanism 29 must move the wafer w to clean the wafer w's entire surface. In the example of FIG. 3, the focusing elements 15a–d are equally spaced vertically by a distance x. Thus, in operation, the scanning mechanism 29 translates the distance x to scan the entire first surface of the wafer w.

Figure 4:
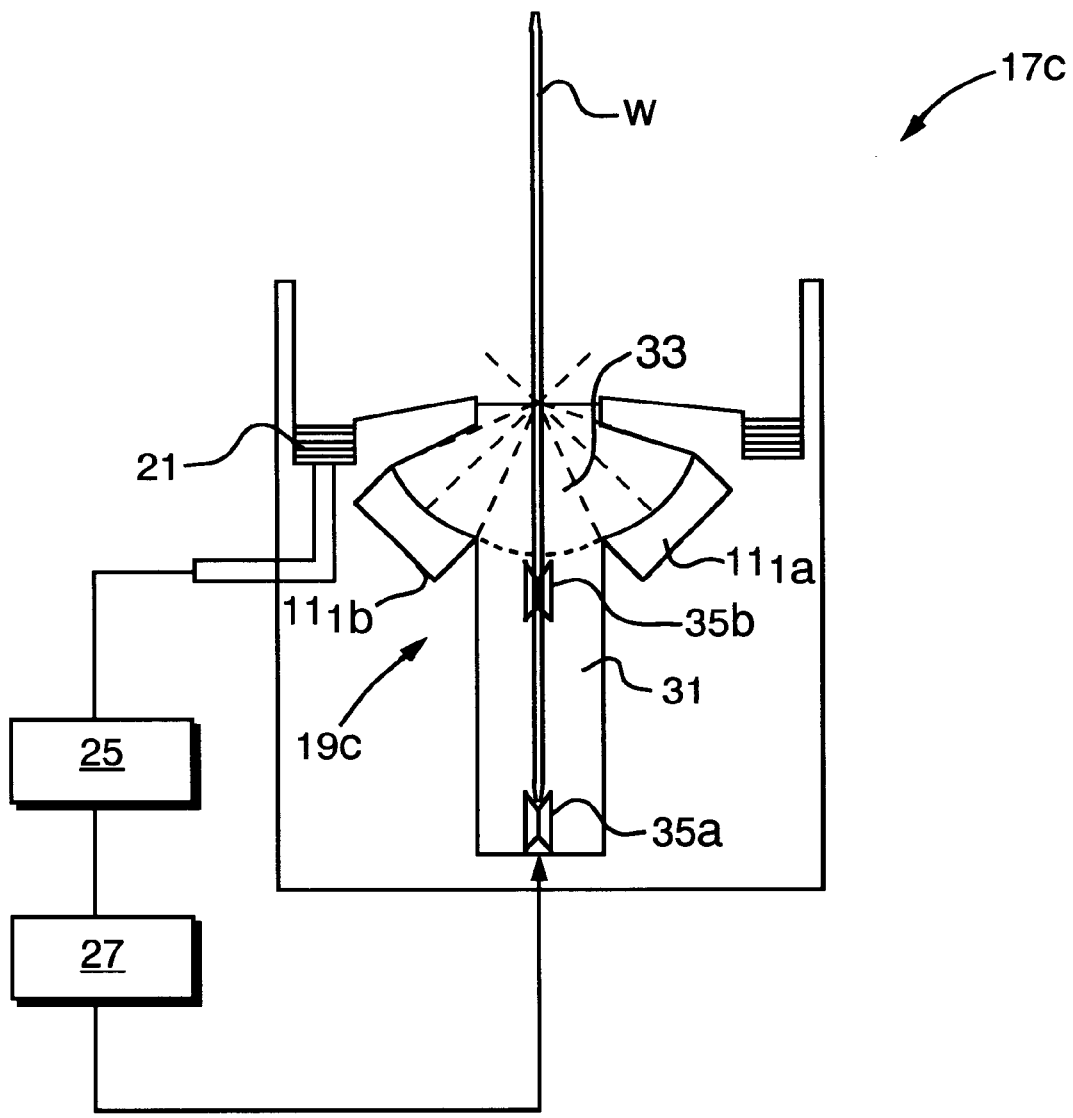
FIG. 4 is a diagrammatic side plan view of a third embodiment of an inventive cleaning system that employs the inventive transducer/focuser assembly of FIG. 1A.

FIG. 4 is a diagrammatic side elevational view of an inventive cleaning system 17c configured in accordance with a third embodiment. The cleaning system 17c comprises the overflow weir 21, the pump 25, and the filter 27 described with reference to FIG. 2. Each of these components is configured and operates as described with reference to FIG. 2. The description therefore is therefore not repeated with reference to FIG. 4.

The tank 19c of FIG. 4 is uniquely designed to minimize cleaning fluid requirements, yet does so in a manner that reduces the number of transducer/focuser assemblies employed, and with a simplified scanning mechanism. Specifically, the tank 19c is dimensioned to submerge only half of a vertically oriented wafer w in cleaning fluid. A first, linearly-configured transducer/focuser assembly $11_1a$ is positioned along the wafer w's first surface and focuses megasonic energy on the wafer w's first surface along an air/fluid interface, as shown in FIG. 4.

The first transducer/focuser assembly $11_1a$ preferably extends a length at least equal to the diameter of the wafer w and is positioned preferably as close to the air/liquid interface as possible, while maintaining an angle that causes the focused megasonic energy transmitted therefrom to reflect from the wafer w's surface out of the top of the tank 19c and into the air. Thus, the reflected megasonic energy does not interfere with and therefore dissipate energy being transmitted to the surface of the wafer w. Preferably, the transducer/focuser assembly $11_1a$ is angled so that all the rays from the focuser are in the range of 10–80° relative to the wafer surface which faces the transducer/focuser assembly $11_1a$. This assures that no acoustic power is reflected back into the transducer.

Coupling the transducer/focusing assembly in a linear relationship and positioning the transducer/focuser assembly $11_1a$ as close to the air/liquid interface as possible enables the tank 19c to be designed for minimal liquid usage. Specifically, with reference to FIG. 4, the tank 19c comprises a lower region 31 which is preferably only slightly larger than the width of the wafer w, and an upper region 33 which is wider in order to house the angled transducer/focuser assembly $11_1a$.

The half-submerged wafer w is easily rotated, thereby scanning megasonic energy (which is focused on the wafer w's diameter along the air/liquid interface) across the wafer w's entire surface. Thus, in the third embodiment the scanning mechanism 29c preferably comprises a plurality of wheels 35a–c, a first wheel 35a, positioned adjacent the bottom of the tank 19c which stabilizes the wafer w, and a pair of motorized wheels 35b and 35c each positioned approximately 80° from the lowest point of the wafer w, which support and rotate the wafer w. The motorized wheels 35b and 35c are preferably positioned approximately 80° from the bottom of the wafer w, so that the wheels 35a, 35b do not block the acoustic wave as it reaches the edges of the wafer w along the horizontal diameter.

In operation focused megasonic energy output by the transducer/focusing assembly $11_1a$ travels through the cleaning fluid toward the air/fluid interface at an angle. Bubbles form when the megasonic energy reaches the surface of the wafer w, thereby facilitating wafer cleaning without scattering energy traveling to the wafer w. After the megasonic energy impacts the surface of the wafer w it reflects out of the tank 19c, and thus does not interfere with and dissipate energy traveling to the wafer w's surface.

While megasonic energy is cleaning a line across the wafer w's diameter, the wheels 35a–c rotate the wafer w such that megasonic energy is scanned across the wafer w's entire front and back surfaces. Preferably the wheels 35a–c rotate the wafer w at a sufficient speed to prevent the unsubmerged portion of the wafer from drying. Alternatively, fluid may be supplied to unsubmerged portions of the wafer w, e.g., via a spray nozzle, etc. Such a nozzle may be positioned to improve efficiency of edge cleaning, as disclosed in U.S. Pat. No. 6,202,658 (AMAT 2733/CMP/RKK) titled METHOD AND APPARATUS FOR CLEANING THE EDGE OF A THIN DISC, filed on even date herewith, the entirety of which is incorporated herein by this reference.

Figure 5:
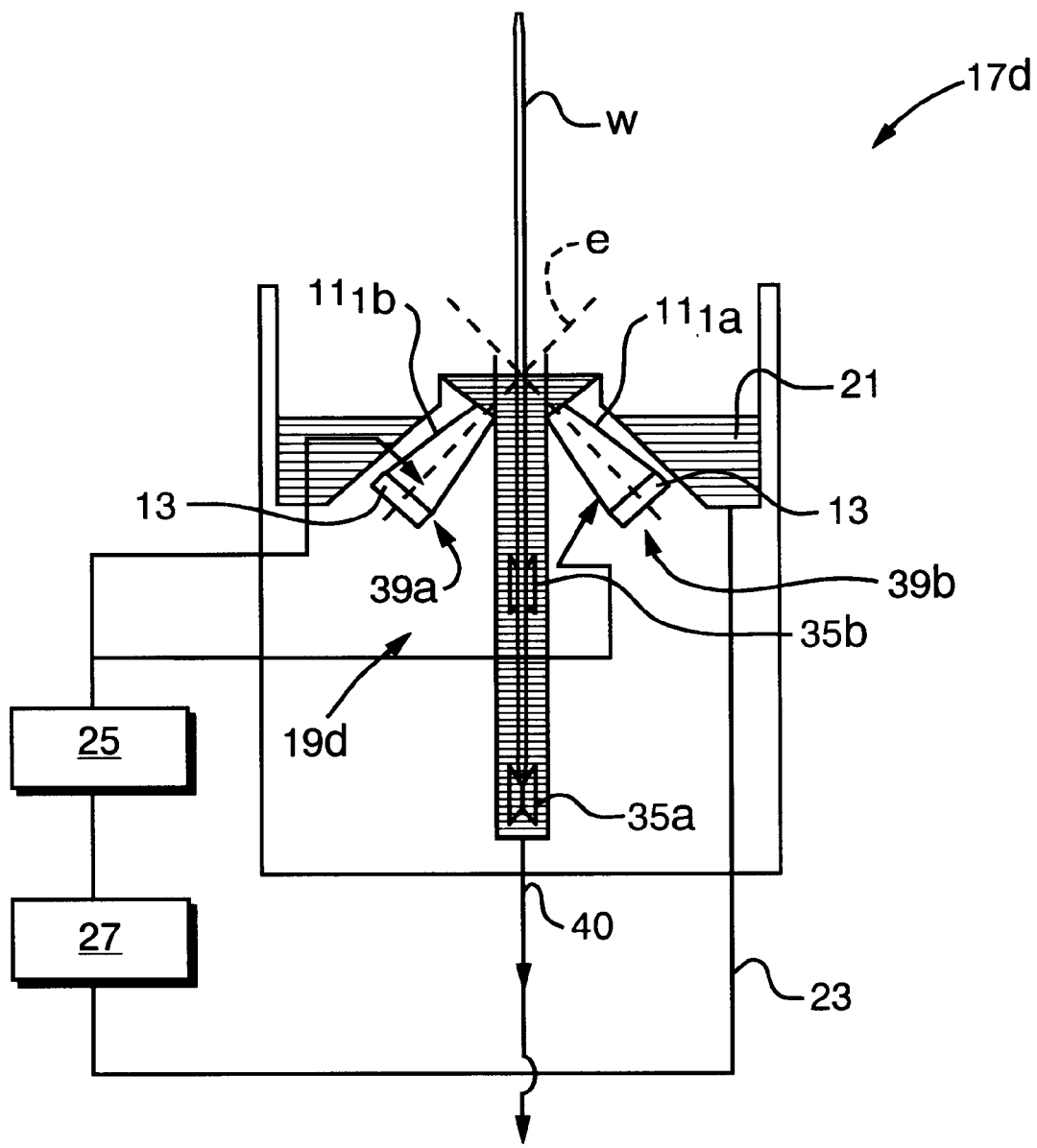
FIG. 5 is a diagrammatic side plan view of a fourth embodiment of an inventive cleaning system that employs the inventive transducer/focuser assembly of FIG. 1A.

FIG. 5 is a diagrammatic side elevational view of an inventive cleaning system 17d configured in accordance with a fourth embodiment. The cleaning system 17d disclosed with reference to FIG. 5 is very similar to the embodiment disclosed with reference to FIG. 4. The wheels 35a–c are configured the same as those described with reference to FIG. 4, and are therefore not further described with reference to FIG. 5.

Like the transducer/focuser assembly $11_1a$ of FIG. 4, the first transducer/focuser assembly $11_1a$ and the second transducer/focus assembly $11_1b$ of FIG. 5 each comprise a transducer 13 and a focusing element, respectively (see FIG. 1A), coupled in a linear relationship, and angularly focused on the wafer w's diameter. The first transducer/focuser assembly $11_1a$ and second transducer/focus assembly $11_1b$ of FIG. 5, however, are respectively contained within nozzles 39a, 39b, that transmit megasonic energy to cleaning fluid passing therethrough. The center line of the nozzles 39a, 39b is positioned within 30° to 60° from the surface of the wafer closest to the nozzle 39a, 39b. This assures that no reflected power reaches the transducer.

Cleaning fluid is supplied to the nozzles 39a, 39b from an overflow weir 21 after passing through the pump 25 and the filter 27. The pipe 23 couples cleaning fluid from the overflow weir 21 to the pump 25, the filter 27 and to the nozzles 39a, 39b. Fluid from the bottom of the tank is coupled to a drain 40 for tank rinsing during maintenance periods.

In operation, cleaning fluid flows from the weir 21 to the pump 25 and filter 27 through the pipe 23 and through the transducer/focuser nozzles 39a, 39b to the surface of the wafer w, in a line along the diameter thereof. As the cleaning fluid passes through the transducer/focuser nozzles 39a, 39b megasonic energy is imparted thereto. The stream of energized cleaning fluid impacts the diameter of the wafer w. The nozzles 39a, 39b are preferably angled between 20 and 70° to the wafer surface, and most preferably 30°, so as to assure total reflection from the wafer surface.

Like the megasonic energy of FIG. 4, the megasonic energy of FIG. 5 cleans a line across the wafer w's diameter as it impacts the wafer w and then reflects away from the wafer at the same angle as the angle at which the megasonic energy approaches the wafer w, as represented by the dashed arrow "e". Thus, the reflected energy does not interfere with the megasonic energy transmitted from the transducer/focuser nozzles 39a, 39b. The wheels 35a–c rotate the wafer w such that megasonic energy is scanned across the wafer w's entire surface. Thus, the wafer w's entire surface is cleaned quickly and efficiently.

After impacting the wafer w, cleaning fluid runs into the weir 21. While the wafer w's surface is being cleaned, the pump 25 pumps the cleaning fluid from the overflow weir 21, through the pipe 23 to the filter 27 where particles are removed, and then returns the recycled cleaning fluid to the nozzles 39a and 39b. After wafer cleaning is complete, the nozzles 39a, 39b are turned off, and cleaning fluid accumulates in the overflow weir 21 until the tank and the entire cleaning system 17d is drained and purged during a preventative maintenance procedure.

The foregoing description discloses only the preferred embodiments of the invention, modifications of the above disclosed apparatus and method which fall within the scope of the invention will be readily apparent to those of ordinary skill in the art. For instance, The invention is not limited to megasonic cleaning or to use with any particular cleaning fluid. Although FIGS. 2 and 3 show transducer/focuser assemblies positioned only along one side of the wafer w, and configured to achieve simultaneous cleaning of both the first and second sides of the wafer. Transducer/focuser assemblies may be positioned along the second side of the wafer and the acoustic energy therefrom focused on each respective side of the wafer w so as not to travel through the wafer w and interfere with cleaning along the remote side of the wafer w. As used herein, a substrate or a wafer includes, but is not limited to a semiconductor wafer with or without material layers thereon, whether patterned or unpatterned.

Although vertical wafer orientation is preferred, other orientations may be employed, and although the exemplary transducer/focuser assemblies are elongated, and preferably longer in length than the wafer's diameter, other transducer/focuser assemblies may be employed. Finally, the angular coupling between the transducer and focusing element may be other than the 90° angle shown in FIG. 3.

Accordingly, while the present invention has been disclosed in connection with the preferred embodiments thereof, it should be understood that other embodiments may fall within the spirit and scope of the invention, as defined by the following claims.

The invention claimed is:

1. An apparatus adapted to clean a semiconductor substrate, comprising:
   a tank adapted to contain liquid;
   a source of sonic energy operatively coupled to the tank;
   a substrate support, operatively coupled to the tank; and
   a focusing element operatively coupled to the source of sonic energy and adapted to focus sonic energy to a focal point;
   wherein the source of sonic energy and the focusing element are positioned such that the focusing element extends in a line along a first major surface of the substrate;
   wherein the focusing element further comprises a first plurality of focusing elements operatively coupled to the source of sonic energy for focusing sonic energy on the back surface of the substrate, wherein each of the plurality of focusing elements extends in a line along the first major surface of the substrate.

2. An apparatus adapted to clean a semiconductor substrate, comprising:
   a tank adapted to contain liquid;
   a source of sonic energy operatively coupled to the tank;
   a substrate support, operatively coupled to the tank; and
   a focusing element operatively coupled to the source of sonic energy and adapted to focus sonic energy output by the source of sonic energy;
   wherein the source of sonic energy and the focusing element are positioned along a first major surface of the substrate;
   wherein the focusing element is adapted to focus sonic energy on a back surface of the substrate.

3. The apparatus of claim 2 wherein the source of sonic energy and the focusing element are positioned such that the focusing element extends in a line along the first major surface of the substrate.

4. The apparatus of claim 3 wherein the focusing element further comprises a first plurality of focusing elements operatively coupled to the source of sonic energy for focusing sonic energy on the back surface of the substrate, wherein each of the plurality of focusing elements extends in a line along the first major surface of the substrate.

5. A method of cleaning a semiconductor substrate, comprising:
   placing a semiconductor substrate in a tank that contains a liquid, the semiconductor substrate having a first major surface and a second major surface; and
   focusing sonic energy on the second major surface of the substrate, the sonic energy being provided from a source of sonic energy located along the first major surface of the substrate and being focused by a focusing element located along the first major surface, the second major surface of the substrate facing away from the focusing element.

6. The method of claim 5 wherein the focusing element extends in a line along the first major surface of the substrate.

7. The method of claim 6 wherein the focusing element includes a plurality of focusing elements that each extends in a line along the first major surface of the substrate.

* * * * *